(12) United States Patent
Wu

(10) Patent No.: US 10,243,030 B2
(45) Date of Patent: Mar. 26, 2019

(54) FOLDABLE DISPLAY DESIGN

(71) Applicant: InnoLux Corporation, Miao-Li County (TW)

(72) Inventor: Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/803,830

(22) Filed: Nov. 5, 2017

(65) Prior Publication Data

US 2019/0006449 A1 Jan. 3, 2019

Related U.S. Application Data

(60) Provisional application No. 62/527,198, filed on Jun. 30, 2017.

(51) Int. Cl.
| | |
|---|---|
| *H01L 51/00* | (2006.01) |
| *H01L 27/32* | (2006.01) |
| *H01L 51/56* | (2006.01) |
| *H01L 27/15* | (2006.01) |

(52) U.S. Cl.
CPC ...... *H01L 27/3262* (2013.01); *H01L 51/0097* (2013.01); *H01L 51/56* (2013.01); *H01L 27/156* (2013.01); *H01L 2227/323* (2013.01); *H01L 2251/5338* (2013.01); *H01L 2251/558* (2013.01)

(58) Field of Classification Search
CPC .............. G06F 1/1652; H01L 51/0097
See application file for complete search history.

(56) References Cited

U.S. PATENT DOCUMENTS

| | | | |
|---|---|---|---|
| 2005/0078459 | A1 | 4/2005 | Yeon |
| 2015/0357387 | A1* | 12/2015 | Lee ............... H01L 51/0097 257/40 |
| 2016/0117002 | A1 | 4/2016 | Lee |
| 2016/0179268 | A1 | 6/2016 | Hong |
| 2016/0240602 | A1 | 8/2016 | Ki |
| 2016/0374191 | A1 | 12/2016 | Kim |
| 2017/0062532 | A1 | 3/2017 | Jeong |
| 2017/0188463 | A1 | 6/2017 | Kim |
| 2017/0237025 | A1 | 8/2017 | Choi |
| 2017/0256599 | A1 | 9/2017 | Kim |
| 2017/0262109 | A1 | 9/2017 | Choi |
| 2017/0271617 | A1 | 9/2017 | Choi |
| 2017/0277288 | A1 | 9/2017 | Choi |
| 2017/0278918 | A1 | 9/2017 | Jeon |
| 2018/0108722 | A1* | 4/2018 | Nishikawa ......... H01L 27/3276 |

* cited by examiner

*Primary Examiner* — Thomas L Dickey
(74) *Attorney, Agent, or Firm* — Winston Hsu

(57) ABSTRACT

A display device comprises a substrate having a foldable first region and a second region adjacent to the foldable first region, wherein a folding axis overlaps the foldable first region. The display device further comprises a first transistor overlapping the foldable first region and having a first channel region with a first dimension along a first direction that is substantially perpendicular to the folding axis. The display device further comprises a second transistor overlapping the second region and having a second channel region with a second dimension along the first direction, wherein the first dimension is less than the second dimension.

19 Claims, 17 Drawing Sheets

FOLDABLE DISPLAY DESIGN

CROSS REFERENCE TO RELATED APPLICATION

This application claims the benefit of U.S. Provisional Patent Application Ser. No. 62/527,198, filed Jun. 30, 2017 and entitled "Display Apparatus", which is incorporated by reference in its entirety.

BACKGROUND OF THE DISCLOSURE

1. Field of the Disclosure

Embodiments disclosed herein relate to a foldable display device and associated method of production, and more specifically, to a foldable display device having a reduced probability of damage during folding.

2. Description of the Prior Art

Foldable display devices offer portability when in a folded state, which expands into a relatively large sized display when in an unfolded state. Foldable display devices may have various applications in electronic displays used in televisions, monitors, and mobile computing devices. Some non-limiting examples of mobile computing devices include smartphones, tablet computers, mobile personal computers (PCs), and electronic book readers. Foldable (or flexible) display devices may have further applicability to wearable devices, such as smartwatches.

SUMMARY OF THE DISCLOSURE

According to various embodiments disclosed herein, exemplary display device implementations are described having a reduced probability of damage during folding of the display device. Such display device implementations are suitable for increasing the portability and/or durability of the display device.

One embodiment of an exemplary display device comprises a substrate having a foldable first region and a second region adjacent to the foldable first region, wherein a folding axis overlaps the foldable first region. The display device further comprises a first transistor overlapping the foldable first region and having a first channel region with a first dimension along a first direction that is substantially perpendicular to the folding axis. The display device further comprises a second transistor overlapping the second region and having a second channel region with a second dimension along the first direction, wherein the first dimension is less than the second dimension.

Another embodiment of a method of producing a foldable display device comprises arranging a plurality of first transistors to overlap a foldable first region of a substrate, wherein a folding axis overlaps the foldable first region, and wherein each of the plurality of first transistors has a respective first channel region with a first dimension along a first direction substantially perpendicular to the folding axis. The method further comprises arranging a plurality of second transistors to overlap a second region of the substrate adjacent to the foldable first region, wherein each of the plurality of second transistors has a respective second channel region with a second dimension along the first direction, and wherein the first dimension is less than the second dimension.

Another embodiment of an exemplary display device comprises a substrate having a foldable first region and a second region adjacent to the foldable first region, wherein a folding axis overlaps the foldable first region. The display device further comprises a display structure overlapping the substrate, a plurality of first transistors included in the display structure and overlapping the foldable first region, and a plurality of second transistors included in the display structure and overlapping the second region. The display structure has a first thickness overlapping the foldable first region and has a second thickness overlapping the second region, and the first thickness is less than the second thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

Figure 1:
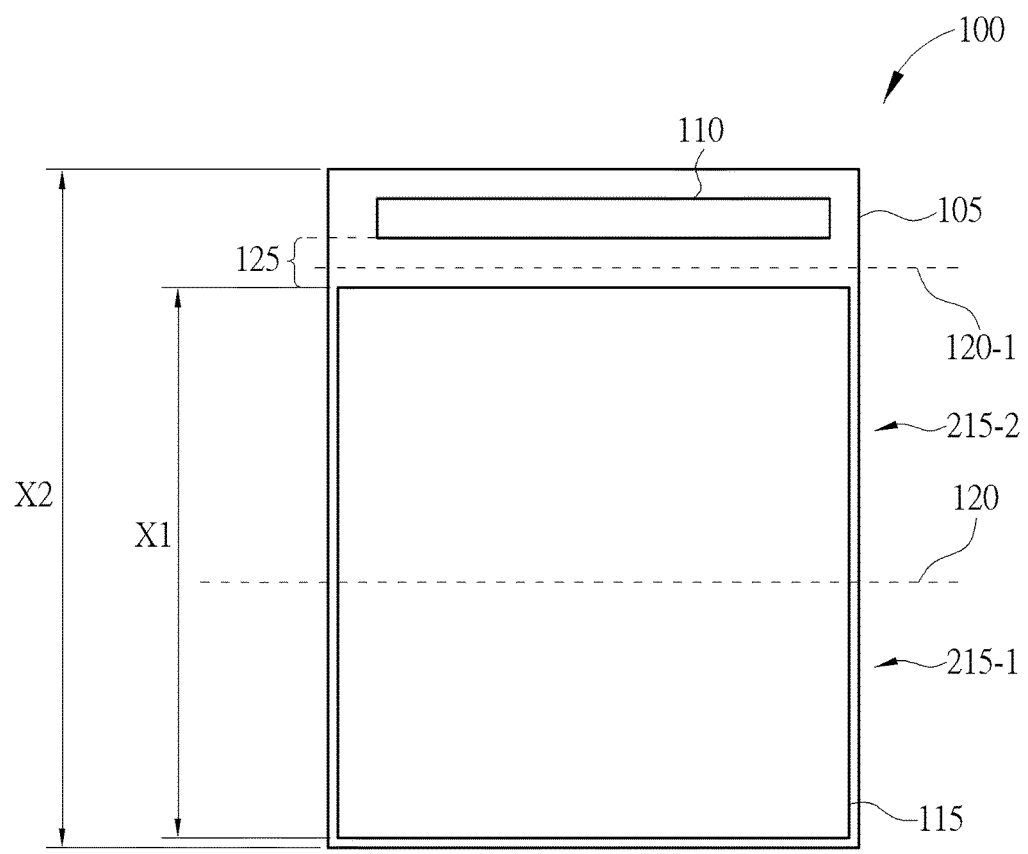
FIG. 1 illustrates exemplary folding axes for a display device, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

FIG. 1 illustrates exemplary folding axes for a display device 100, according to embodiments described herein. The display device 100 comprises an integrated circuit (IC) 110 disposed on a substrate 105. In this embodiment, the IC 110 is disposed on a relatively short side of the substrate 105. In other embodiment, the IC 110 may be disposed on a relatively long side of the substrate 105 or with any suitable alternate positioning, but is not limited thereto. The IC 110 is configured to control operation of display units included in the display device 100. In some embodiments, the substrate 105 includes a flexible printed circuit board (not shown), and the IC 110 may be configured to communicate with an external processor through the flexible printed circuit board.

The display device 100 comprises an active region 115 in which imagery is displayed using one or more of the display units. In some embodiments, each display unit corresponds to a respective pixel, and the active region 115 comprises a plurality of (M×N) pixels that are arranged in a pattern of M rows and N columns, where M and N are each positive integers. The active region 115 may include any alternate number of pixels with any suitable spatial arrangement.

In some embodiments, each pixel comprises one or more sub-pixels according to a predefined color model. Some examples of color models include a RGB (red, green, and blue) color model, a RGBW (red, green, blue, and white) color model, a RGBY (red, green, blue, and yellow) color model, a RGBG color model, and a RBGB color model. Other color models are also possible. In some embodiments, each pixel may correspond to one sub-pixel. In other embodiments, each pixel may correspond to a plurality of sub-pixels.

Each display unit (or pixel) includes one or more light-emitting elements according to any suitable display technologies, whether now known or later developed. Some non-limiting examples of display technologies include light-emitting diodes (LEDs), organic LEDs (OLEDs), quantum dot LEDs (QLEDs), and so forth. In one embodiment, the display units comprise micro-LEDs having a size (e.g., a diameter or a largest dimension) between about ten micrometers (10 µm) and about one hundred (100) micrometers (100 µm). Alternately, the micro-LEDs may have a size such as less than ten micrometers (10 µm) and greater than one micrometer (1 µm).

The display device 100 may be flexible along one or more directions, and may correspond to a display panel that is one or more of: curved, bendable, foldable, rollable, or stretchable. In some embodiments, the display device 100 corresponds to one or more folding axes 120-1, 120 (generically, a folding axis 120), about which the display device 100 is configured to be repeatably bent or folded without causing appreciable damage to the display device 100. For example, the substrate 105 may include one or more flexible or foldable regions corresponding to each folding axis 120, which permits other regions of the substrate 105 to have their relative arrangement changed. For example, by folding (or otherwise bending) the foldable regions of the display device 100, the non-flexible regions of the display device 100 may fold, slide, shift, etc. relative to each other. The flexible or foldable regions of the substrate 105 may include any suitable material or materials, whether known or later-developed. Some non-limiting examples of flexible materials include a polymer layer such as a thin plastic film formed from polyimide, polyethylene naphthalate (PEN), polyethylene terephthalate (PET), or other suitable polymers or combination of such polymers. In some embodiments, the substrate 105 is substantially uniformly flexible. In other embodiments, the substrate 105 is relatively more stiff or rigid in one or more non-foldable regions. In one example, the substrate 105 may include a same material composition in foldable regions and non-foldable regions, but has a greater thickness in the non-foldable regions. In another example, the foldable regions and non-foldable regions of the substrate 105 have substantially a same thickness with different material compositions.

As shown in FIG. 1, a first folding axis 120-1 overlaps the substrate 105 at a region 125 that is disposed between the IC 110 and the active region 115. This may correspond to cases in which the IC 110 itself is not flexible. As discussed herein, "overlapping" refers to spatial overlap as viewed from a top view of the display device 100, the substrate 105, a display structure 205 or a component sublayer (FIG. 2), and so forth. In implementations having a flexible IC 110, at least part of the IC 110 may be disposed to overlap the folding axis 120, but is not limited thereto. A second folding axis 120 overlaps the active region 115 of the substrate 105. Generally, each folding axis 120-1, 120 may have any suitable location relative to the substrate 105. For example, the folding axis 120 may represent an approximate centerline of the active region 115, which is shown relative to a dimension X1 of the active region 115 that is substantially perpendicular to the folding axis 120. In some cases, the dimension X1 corresponds to a width or a length of the active region 115, but is not limited thereto. Alternately, the folding axis 120 may represent an approximate centerline of the display device 110, which is shown relative to a dimension X2 of the display device 110 that is substantially perpendicular to the folding axis 120. Although the folding axes 120-1, 120 are depicted as being substantially parallel to each other, other non-parallel arrangements of folding axes 120 are also possible. Further, other suitable numbers of folding axes 120 may be implemented in the display device 100, such as one folding axis 120, or three or more folding axes 120.

Figure 2:
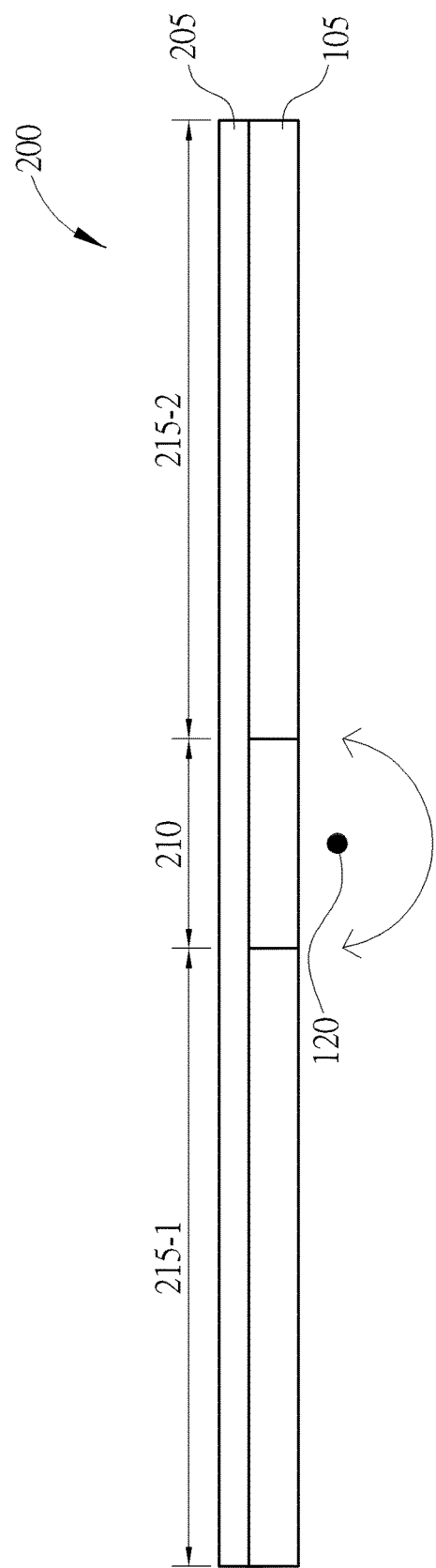
FIG. 2 is a schematic diagram of an exemplary display device having different regions, according to embodiments described herein.
Figure 3A:
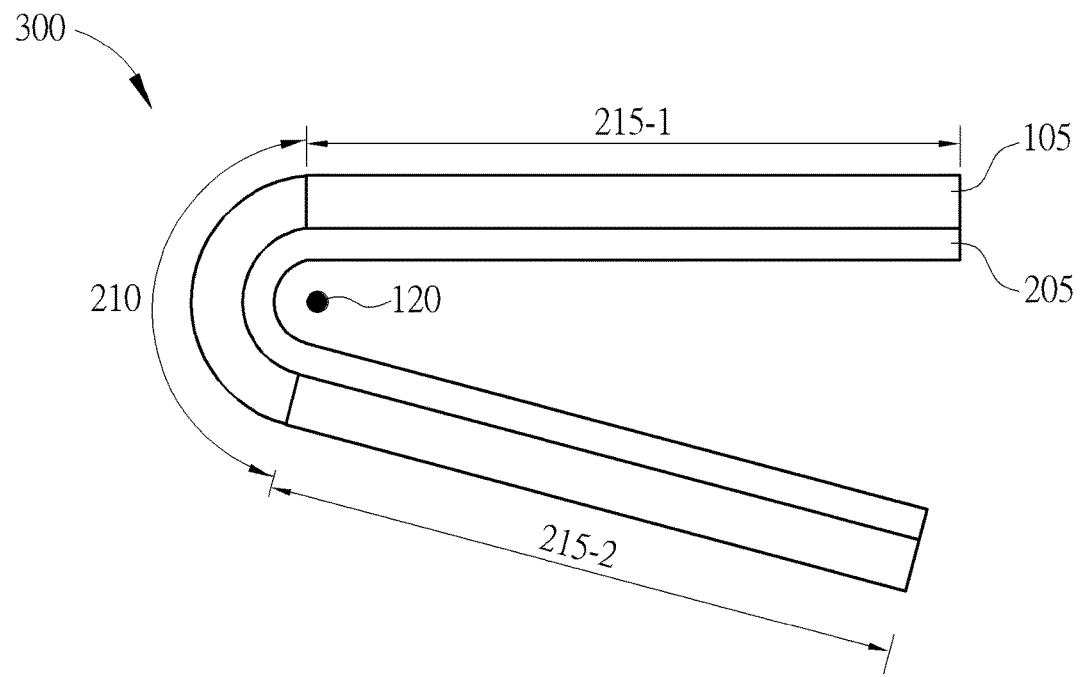
FIGS. 3A-3D illustrate exemplary folding of the display device, according to embodiments described herein.
Figure 3B:
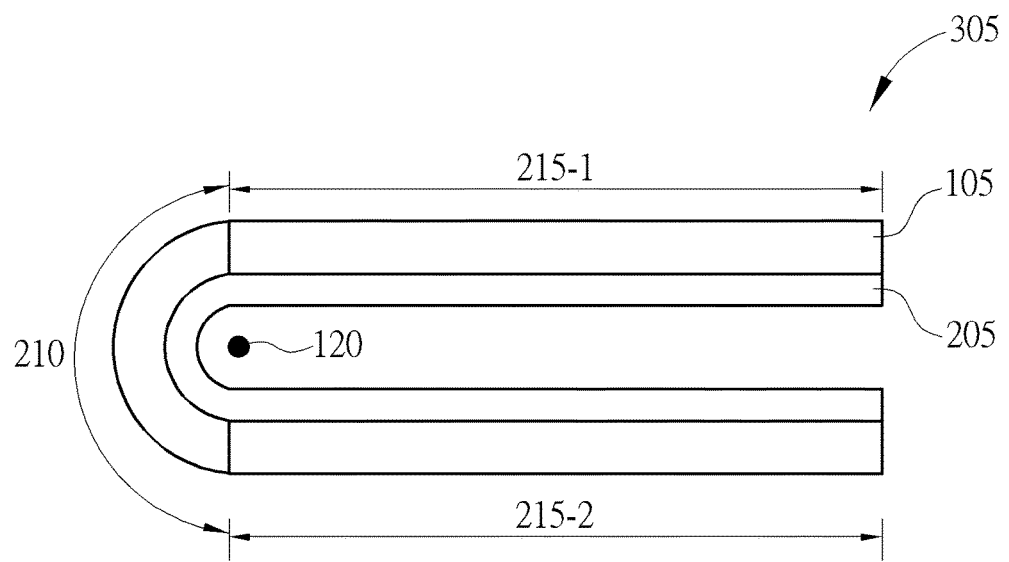
Figure 3C:
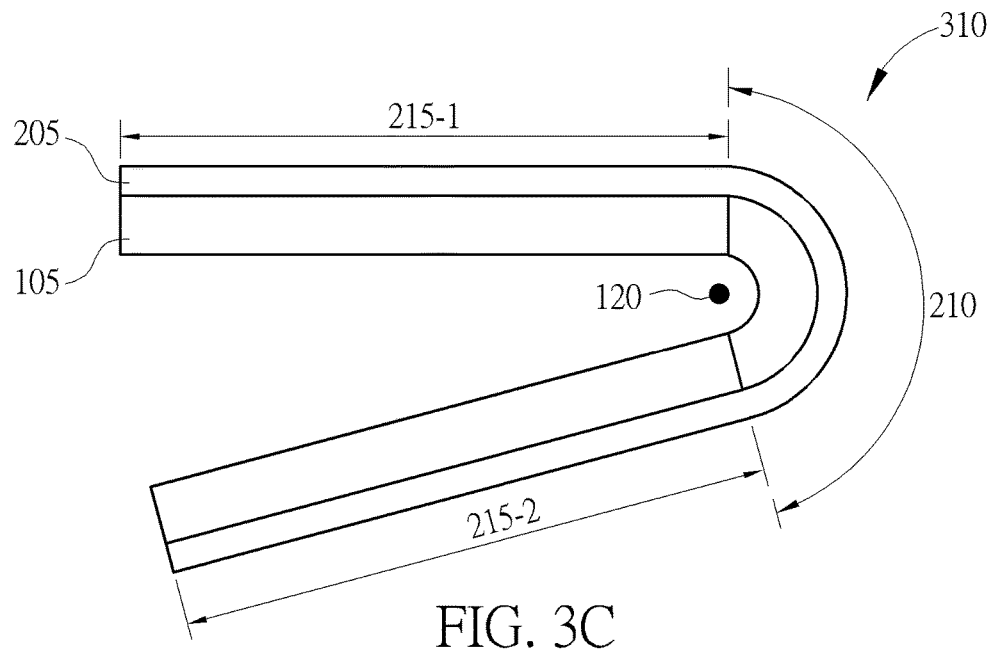
Figure 3D:
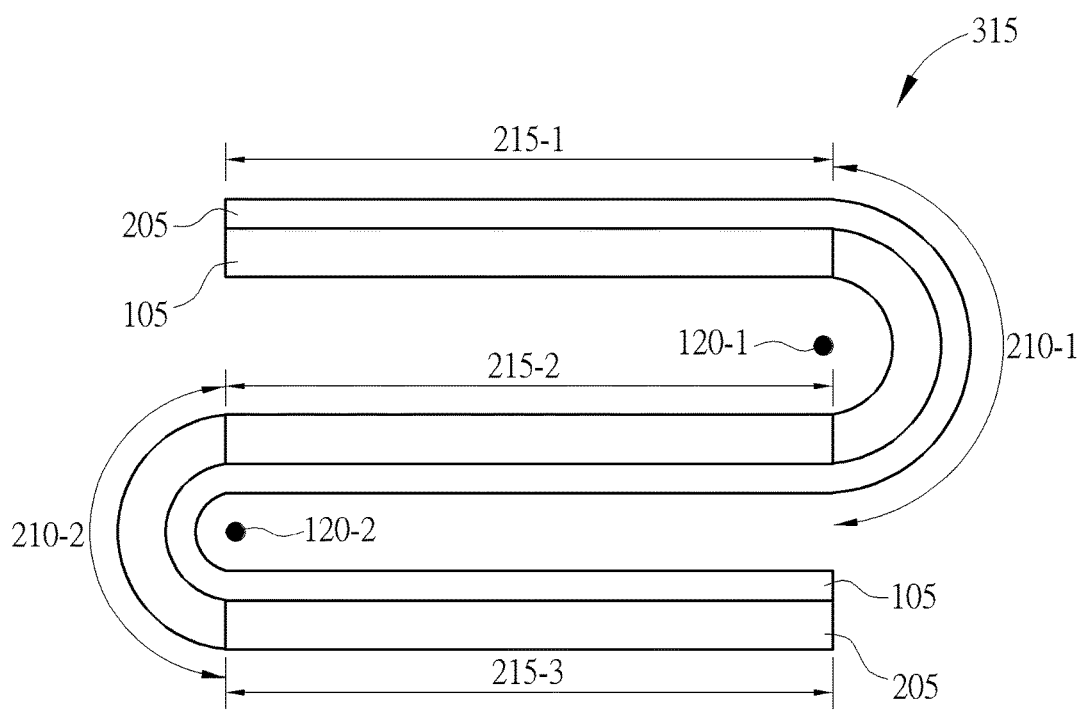

FIG. 2 is a schematic diagram 200 of an exemplary display device having different regions, according to embodiments described herein. The schematic diagram 200 depicts a display structure 205 that overlaps the substrate 105 from a top view. The display structure 205 is disposed on the substrate 105. As will be discussed below with respect to FIG. 5, the display structure 205 may comprise a display unit layer 505 and a circuit layer 510. The display unit layer 505 may comprise a plurality of sublayers, such as an encapsulation sublayer 515, a barrier sublayer 520 and a light emitting sublayer 525. The circuit layer 510 may comprise a semiconductor sublayer 530 and a buffer sublayer 540. Layers other than the display structure 205 may also be included.

As shown in FIG. 1 and FIG. 2, the substrate 105 has a foldable first region 210 corresponding to the folding axis 120, and second regions 215-1 and 215-2 adjacent to the foldable first region 210. The foldable first region 210 of the substrate 105 is disposed between the second regions 215-1 and 215-2 (generically, a second region 215). In some embodiments, the second regions 215-1 and/or 215-2 are relatively stiff relative to the foldable first region 210. In some cases, the relatively stiff second regions 215-1 and/or 215-2 may help to limit the bending of the substrate 105 to only those intended modes (e.g., around the folding axis 120). In other embodiments, the substrate 105 may be substantially uniformly flexible, such that the second regions 215-1, 215-2 are also flexible or foldable. As shown, the folding axis 120 overlaps with the foldable first region 210 from a top view, and as depicted extends into and out of the page. While a single foldable first region 210 and two second regions 215-1, 215-2 are depicted, alternate numbers of the respective regions are also possible.

FIGS. 3A-3D illustrate exemplary folding of the display device, according to embodiments described herein. In diagram 300, the display structure 205 is oriented inward when the display device is bent or folded about the folding axis 120. In diagram 305, the display structure 205 is oriented inward to a fully-folded position in which the second region 215-1 has a 180° orientation relative to the second region 215-2. In diagram 310, the display structure 205 is oriented outward when the display device is bent or folded about the folding axis 120.

In diagram 315, the display device comprises foldable first regions 210-1, 210-2, and second regions 215-1, 215-2, 215-3. A folding axis 120-1 overlaps with the foldable first region 210-1, and a folding axis 120-2 overlaps with the foldable first region 210-2. As shown, a first portion of the display structure 205 that is folded around the folding axis 120-1 is oriented outward, and a second portion of the display structure 205 that is folded around the folding axis 120-2 is oriented inward.

Figure 4:
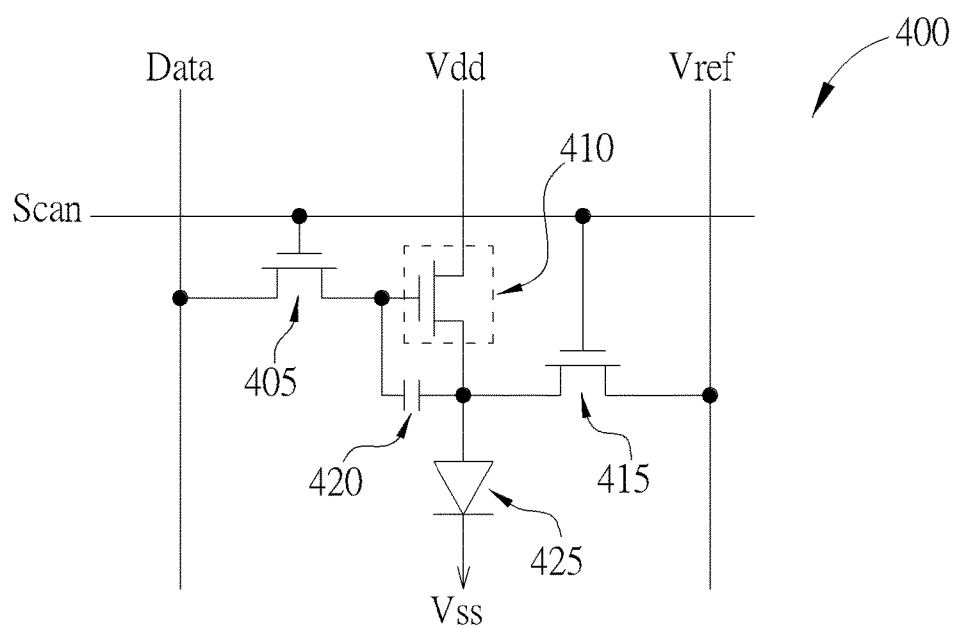
FIG. 4 is a circuit diagram illustrating an exemplary arrangement of display driver circuitry, according to embodiments described herein.

FIG. 4 is a circuit diagram 400 illustrating an exemplary arrangement of display driver circuitry, according to embodiments described herein. The circuit diagram 400 may be used in conjunction with other embodiments described herein, such as for driving the display units of the display device 100 of FIG. 1.

The circuit diagram 400 comprises a switch transistor 405, a driving transistor 410, and a reset transistor 415. The switch transistor 405 is configured to receive a first control signal ("Scan") that is shared with the reset transistor 415. Based on the first control signal, the switch transistor 405 is configured to conduct a data signal ("Data") across a channel of the switch transistor 405.

The driving transistor 410 is configured to receive the data signal from the switch transistor 405. Based on the data signal, the driving transistor 410 is configured to conduct current across a channel of the driving transistor 410 into an input node for a light-emitting element 425. As shown, the driving transistor 410 is configured to couple a first supply voltage (Vdd) with the input node. Some non-limiting examples of the light-emitting element 425 comprise LEDs, micro-LEDs, OLEDs, and QLEDs.

A storage capacitor 420 is coupled between a control terminal of the driving transistor 410 and the input node. The storage capacitor 420 is configured to maintain values of the data signal at the control terminal.

The reset transistor 415 is configured to receive the first control signal. Based on the first control signal, the reset transistor 415 is configured to conduct a reference voltage signal (Vref) across a channel of the reset transistor 415 into the input node.

The light-emitting element 425 is coupled between the input node and a second supply voltage (Vss; alternately "VCOM" or "ground"). As shown, an anode of the light-emitting element 425 is connected with the input node, and a cathode of the light-emitting element 425 is connected with Vss. However, other implementations may have the anode and cathode of the light-emitting element 425 reversed.

Figure 5:
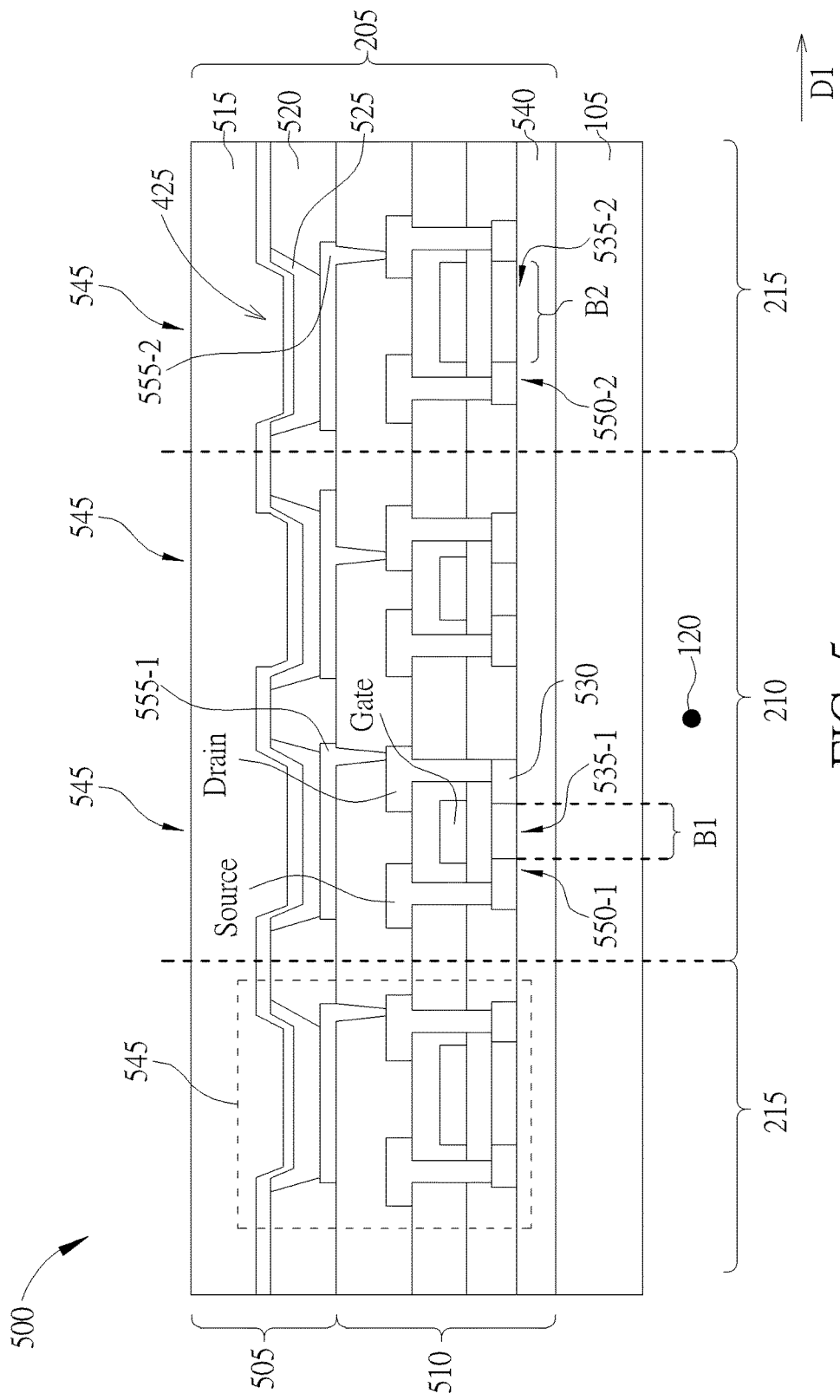
FIG. 5 is a schematic diagram of an exemplary display device having differently-sized channel regions, according to embodiments described herein.

FIG. 5 is a schematic diagram 500 of an exemplary display device having differently-sized channel regions, according to embodiments described herein. The display device may be used in conjunction with other embodiments described herein, such as the display device depicted in FIG. 2 and/or the circuit diagram 400 of FIG. 4.

The schematic diagram 500 includes the display structure 205 overlapping the substrate 105. Although shown as a single element, the substrate 105 may include a plurality of elements, such as a flexible substrate layer, a supporting film layer, a supporting film adhesive, and so forth.

The display structure 205 comprises a display unit layer 505 overlapping a circuit layer 510. The display unit layer 505 comprises an encapsulation sublayer 515 that defines an external surface of the display device 100. The encapsulation sublayer 515 overlaps a light emitting sublayer 525, which are interspersed with sections of a barrier sublayer 520. Described differently, the barrier sublayer 520 forms a plurality of openings and the light emitting sublayer 525 is formed in the plurality of openings. Although not specifically labeled, the display unit layer 505 may comprise conductive connections above (i.e., between the encapsulation sublayer 515 and the light emitting sublayer 525, and may be defined as a cathode) and below (i.e., between the light emitting sublayer 525 and the circuit layer 510, and may be defined as an anode) the light emitting sublayer 525. In other words, overlapping (from top view) of the conductive connection above (i.e., the cathode), the light emitting sublayer 525 and the conductive connections below (i.e., the anode) may be defined as a plurality of light-emitting elements 425.

The schematic diagram 500 comprises a plurality of display units 545, each of which comprises a respective transistor implemented in the circuit layer 510, and the respective light-emitting element 425. Although not specifically labeled, the circuit layer 510 may include one or more electrically insulative sublayers for insulating various components of the circuit layers 510. For example, the circuit layer 510 comprises a buffer sublayer 540 arranged between the transistors and the substrate 105.

In some embodiments, a first transistor 550-1 overlaps the foldable first region 210 and has a first channel region 535-1 with a first dimension B1 along a first direction D1 that is substantially perpendicular to the folding axis 120. A second transistor 550-2 overlaps the second region 215 and has a second channel region 535-2 with a second dimension B2 along the first direction D1. The first dimension B1 is less than the second dimension B2. In some embodiments, the first transistor 550-1 and the second transistor 550-2 are each a respective driving transistor 410, but are not limited thereto. In other embodiments, the first transistor 550-1 and/or the second transistor 550-2 are other transistors included in the display structure 205. In some embodiments, the display structure 205 further comprises a first pixel electrode 555-1 connected with the first transistor 550-1, and a second pixel electrode 555-2 connected with the second transistor 550-2.

Each transistor comprises a gate terminal ("Gate"), a source terminal ("Source") and a drain terminal ("Drain"), wherein the source terminal ("Source") and the drain terminal ("Drain") are coupled with a semiconductor sublayer 530 of the circuit layer 510. As shown, a first channel region 535-1 of the first transistor 550-1 within the foldable first region 210 corresponds to a first dimension (or breadth) B1 along a first direction D1. The first direction D1 is substantially perpendicular to the folding axis 120, and is also substantially parallel to the substrate 105. A second channel region 535-2 of the second transistor 550-2 disposed within the second region 215 corresponds to a second dimension B2 along the first direction D1.

The channel regions 535-1 disposed in the foldable first region 210 may be particularly susceptible to damage in response to folding or bending the display device. Sustained damage to the channel regions 535-1 changes the properties of the corresponding first transistor 550-1, which can affect the quality of light emitted by the light-emitting element 425.

In some embodiments, a first channel region 535-1 of the first transistor 550-1 within the foldable first region 210 is differently sized than a second channel region 535-2 of the second transistor 550-2 disposed within the second region 215. In some embodiments, the first dimension B1 and the second dimension B2 are controlled according to Equation (1):

$$0.3 \leq (B1/B2) \leq 0.95 \tag{1}$$

In other words, a ratio of the first dimension B1 to the second dimension B2 is greater than or equal to 0.3 and less than or equal to 0.95. In some embodiments, sizing the first channel region 535-1 to have a smaller first dimension B1 than the second dimension B2 operates to reduce the probability of sustaining damage within the first channel region 535-1, which results in an increased reliability of the display device.

Figure 6A:
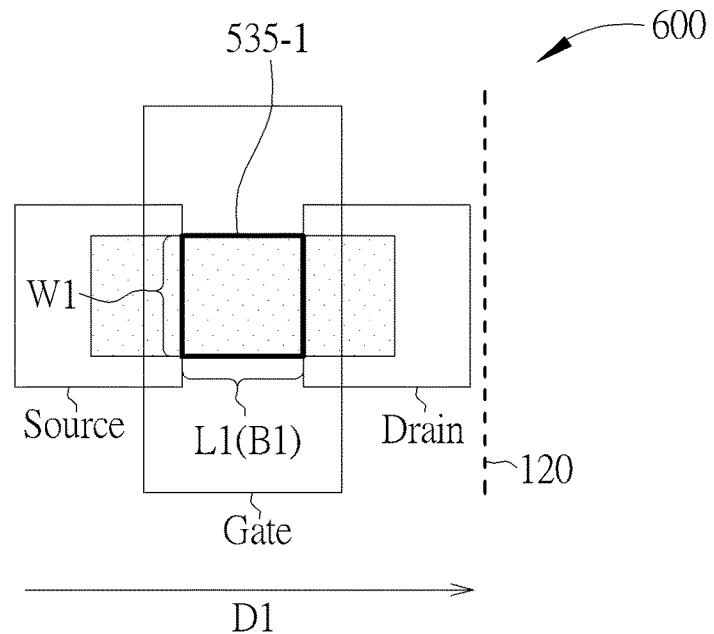
FIGS. 6A and 6B illustrate different configurations of a channel region relative to a folding axis, according to embodiments described herein.
Figure 6B:
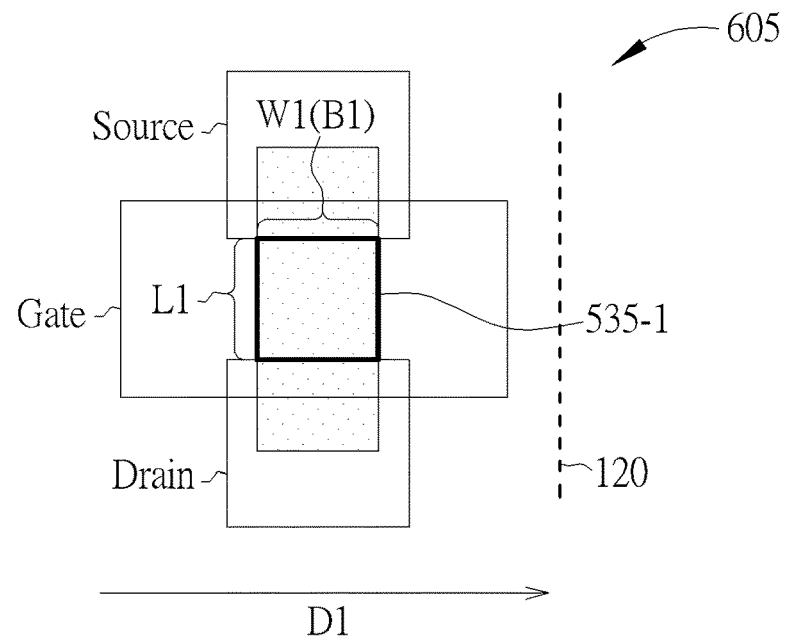

FIGS. 6A and 6B illustrate different configurations 600, 605 of a channel region 535-1 relative to a folding axis 120, according to embodiments described herein. The configurations 600, 605 may be used in conjunction with other embodiments described herein, such as the display device depicted in FIG. 5. In the configuration 600, the first dimension B1 along the first direction D1 (substantially perpendicular to the folding axis 120) corresponds to a length L1 of the channel region 535-1 of a thin film transistor. In the configuration 605, the first dimension B1 corresponds to a width W1 of the channel region 535-1 of a thin film transistor.

Figure 7A:
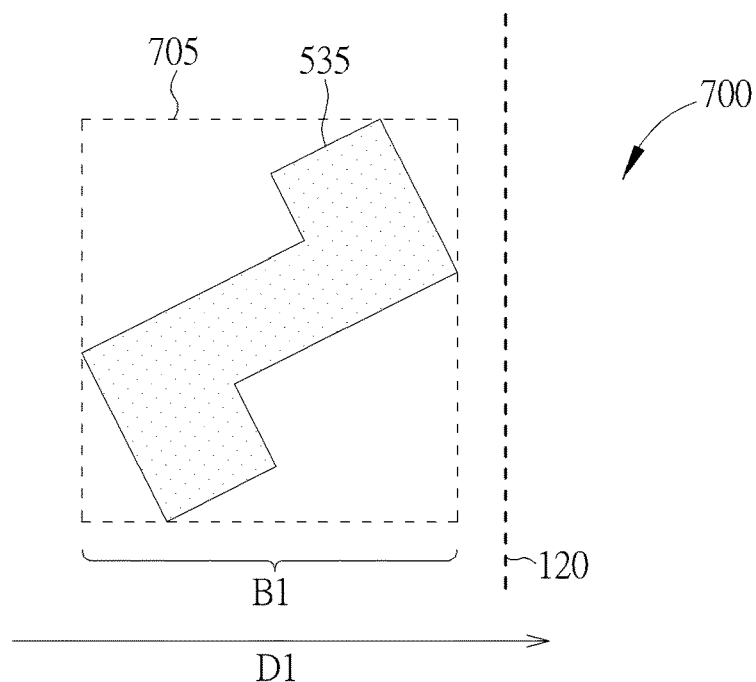
FIGS. 7A and 7B illustrate exemplary off-axis channel regions, according to embodiments described herein.
Figure 7B:
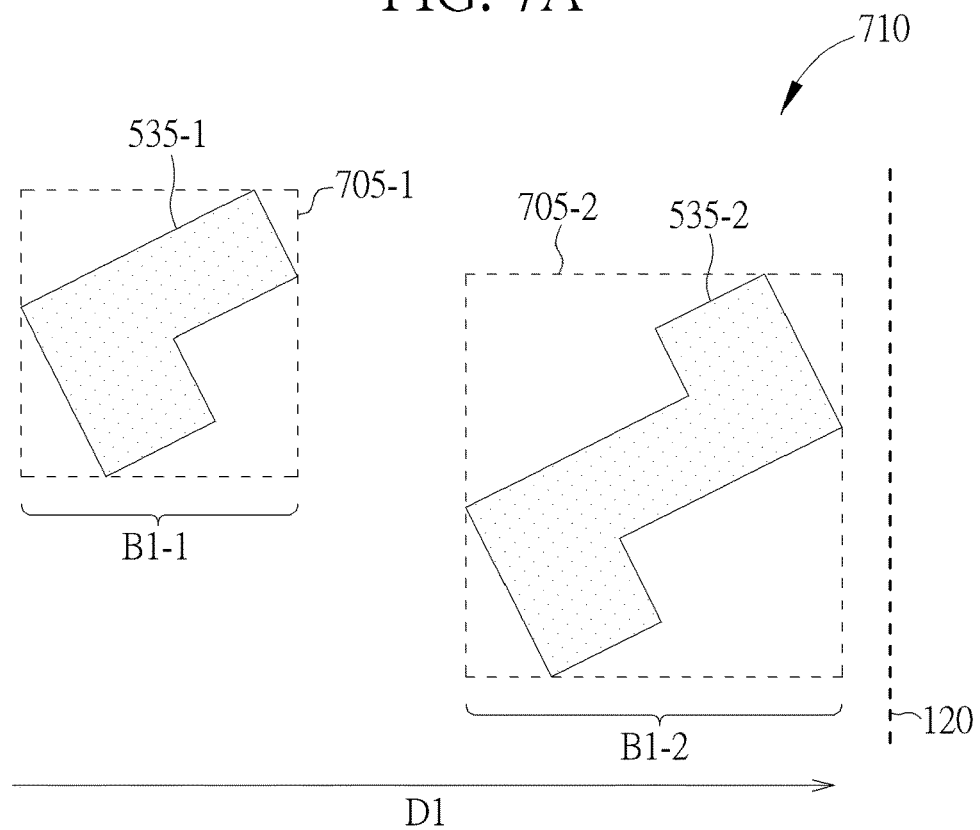

FIGS. 7A and 7B illustrate exemplary off-axis channel regions 535, according to embodiments described herein. Configurations 700, 710 may be used in conjunction with other embodiments described herein, such as the display device depicted in FIG. 5. Configuration 700 illustrates a continuous channel region 535 having a long axis that is "off-axis"—in other words, the long axis has an orientation that is neither parallel to the folding axis 120, nor parallel to the first direction D1. In such a case, the extent of the channel region 535 in the first direction D1 is graphically illustrated using a bounding box 705. The bounding box 705 is a minimum rectangle to define the channel region 535 with sides parallel to or perpendicular to the folding axis 120. The first dimension B1 of the channel region 535 may be determined as the dimension of the bounding box 705 in the first direction D1. The determined first dimension B1 may be used in conjunction with Equation 1 to determine the relative sizing of the channel regions 535 of different regions of the display device.

Configuration 710 illustrates a distributed (or discontinuous) channel region comprising a first channel region 535-1 and a second channel region 535-2 for a transistor. As shown, a dimension B1-1 of the first channel region 535-1 (defined by a side of a bounding box 705-1 perpendicular to the folding axis 120) is less than a dimension B1-2 of the second channel region 535-2 (defined by a side of a bounding box 705-2 perpendicular to the folding axis 120). The larger of the dimension B1-1, B1-2 may be used in conjunction with Equation 1 (in this embodiment, the dimension B1-2 is used to represent the dimension of the channel region) to determine the relative sizing of the channel regions 535 of different regions of the display device.

Further, while FIGS. 6A, 6B, 7A, and 7B illustrate exemplary channel regions corresponding to individual transistors, the person of ordinary skill will understand that the channel regions for the various transistors of a display device need not be identical, but may have different dimensions and/or orientations and/or shapes. For example, the transistors within a particular region (e.g., the foldable first region 210, the second region 215-1, or the second region 215-2) may be substantially identical, or may differ from each other. Further, the transistors within one region may be different from transistors within another region.

Figure 8A:
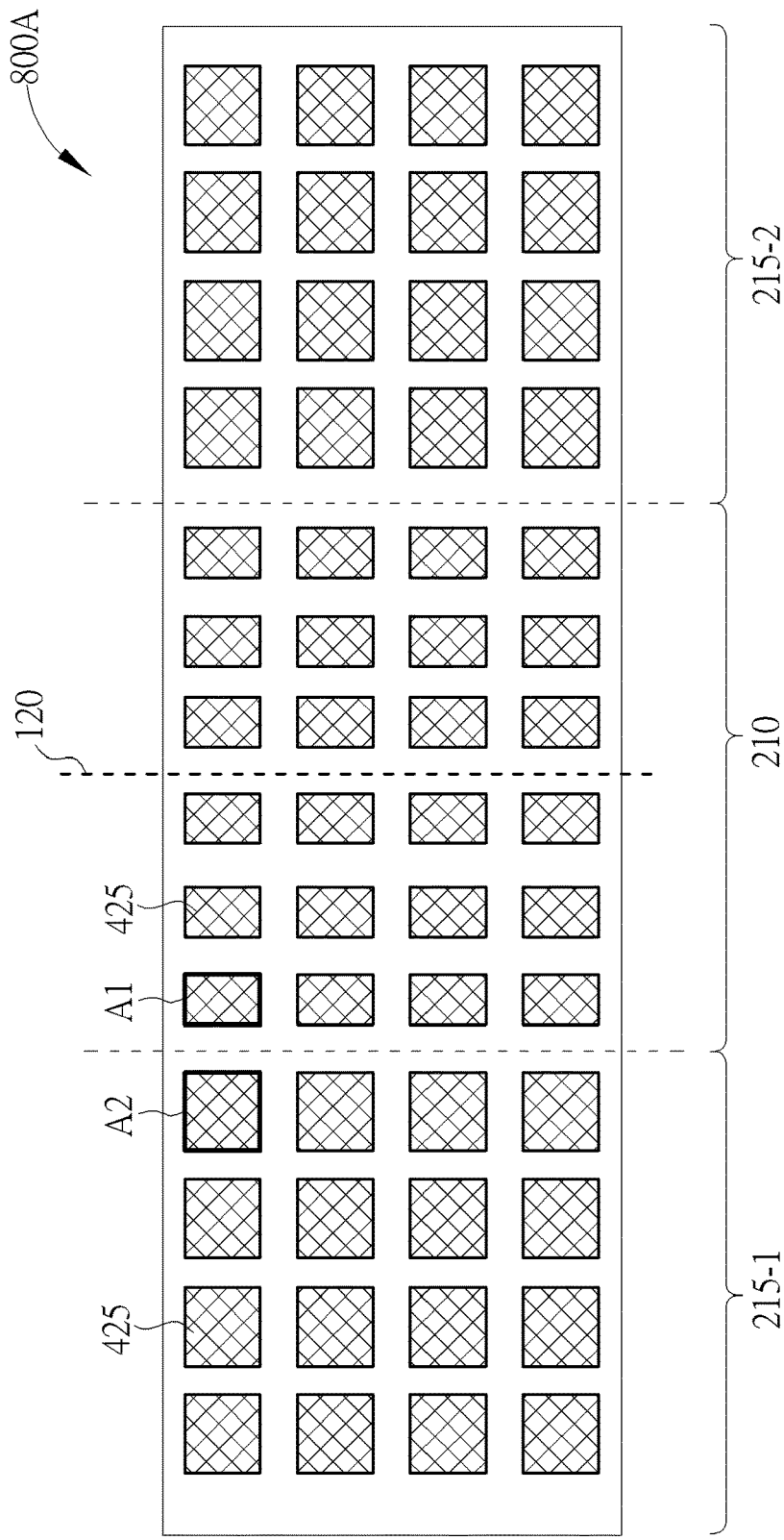
FIGS. 8A, 8B, and 9 are diagrams illustrating exemplary arrangements of channel regions and/or display units, according to embodiments described herein.
Figure 8B:
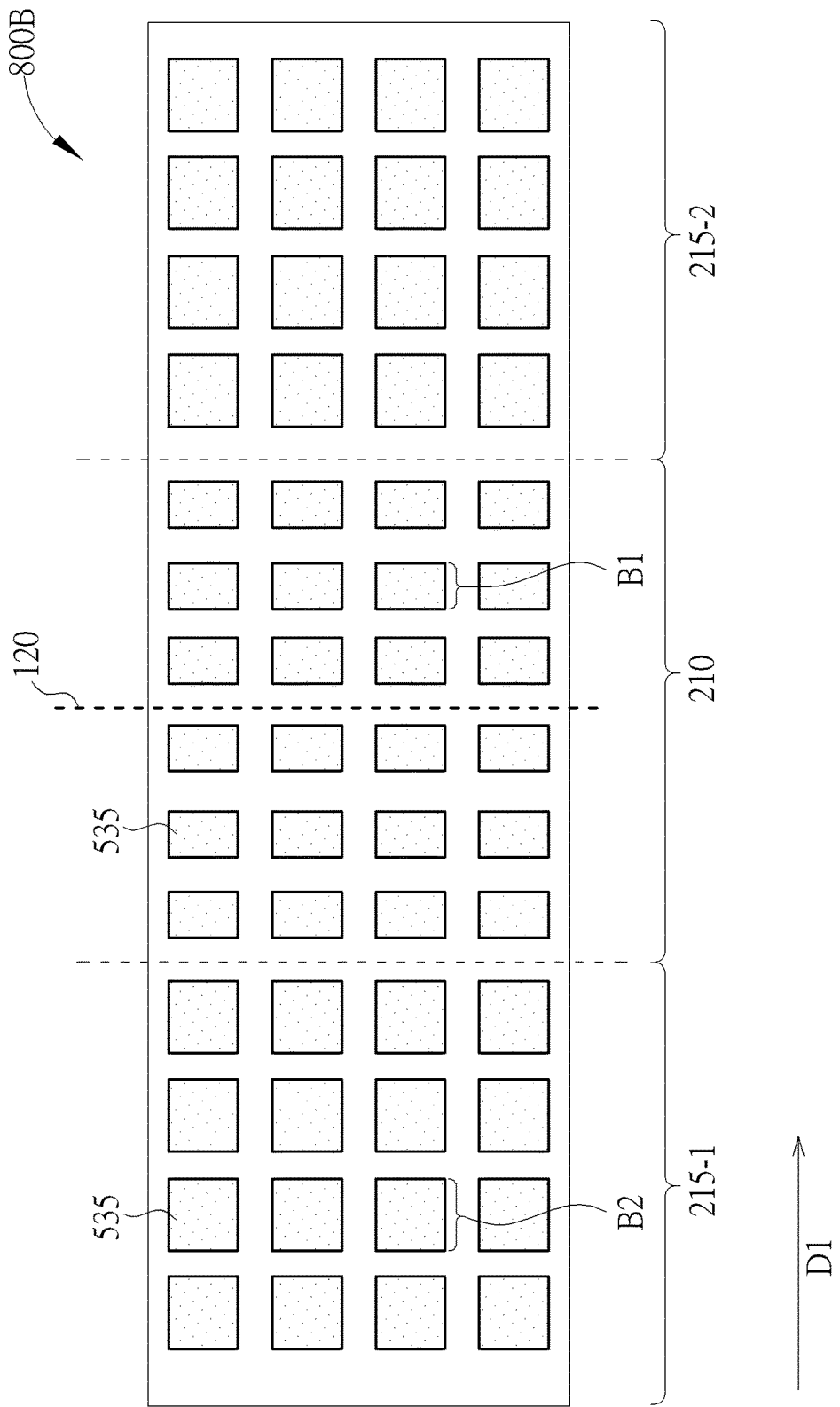
Figure 9:
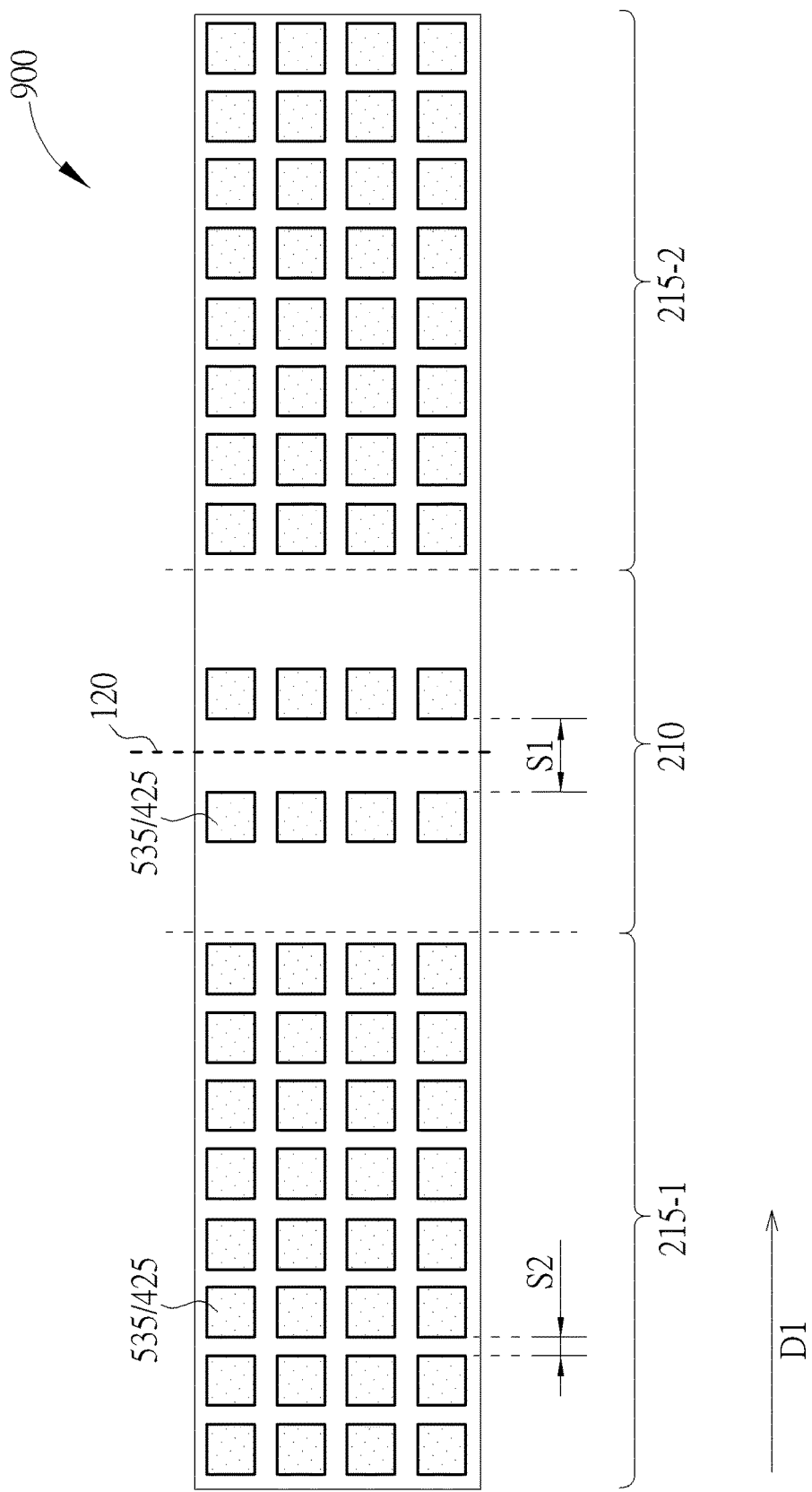

FIGS. 8A, 8B, and 9 are diagrams illustrating exemplary arrangements 800A, 800B, 900 of channel regions 535 and/or display units 425, according to embodiments described herein. More specifically, the features discussed with respect to the arrangements 800A, 800B, 900 may be applicable to display device implementations.

As discussed above with respect to FIG. 5, and as illustrated in arrangement 800A, a first area A1 of one of the display units 425 in the foldable first region 210 is less than a second area A2 of one of the display units 425 in the second region 215-1 and/or the second region 215-2. The first area A1 and/or the second area A2 may be defined as an area of one of the openings of the barrier layer 520 from a top view. In some embodiments, having a smaller first area A1 operates to reduce the probability of sustaining damage within the foldable first region 210, which results in an increased reliability of the display device. Thus, in one embodiment, a plurality of first display units 425 are arranged to overlap the foldable first region 210 and a plurality of second display units 425 are arranged to overlap the second region 215-1 and/or the second region 215-2, and wherein a first area A1 of one first display unit 425 of the plurality of first display units is less than a second area A2 of one second display unit 425 of the plurality of second display units.

In some embodiments, and as illustrated in arrangement 800B, a first dimension B1 of one of a channel region 535 in the foldable first region 210 may be smaller than a second dimension B2 of one of a channel region 535 in the second region 215-1 and/or the second region 215-2 in the first direction D1. In some embodiments, the relative proportions of the first dimension B1 and second dimension B2 may be controlled according to Equation (1).

In some embodiments, and as illustrated in arrangement 900, a first spacing distance S1 may be defined between adjacent first channel regions 535 of the first transistors of the foldable first region 210, and a second spacing distance S2 may be defined between adjacent second channel regions 535 of the second transistors of the second regions 215-1, 215-2. The first spacing distance S1 and the second spacing distance S2 are defined as a minimum distance between adjacent channel regions relative to the first direction D1. The first spacing distance S1 may be greater than the second spacing distance S2.

Thus, in one embodiment, a plurality of first transistors are arranged to overlap the foldable first region 210 and a plurality of second transistors are arranged to overlap the second region 215-1, 215-2, wherein first channel regions 535 of two adjacent first transistors are separated by a first spacing distance S1 along the first direction D1, wherein second channel regions 535 of two adjacent second transistors are separated by a second spacing distance S2 along the first direction D1, and wherein the first spacing distance S1 is greater than the second spacing distance S2.

Alternatively, the first spacing distance S1 may be defined between adjacent display units 425 of the foldable first region 210, and the second spacing distance S2 may be defined between adjacent display units 425 of the second regions 215-1, 215-2. The first spacing distance S1 and the second spacing distance S2 are defined as a minimum distance between adjacent display units relative to the first direction D1. Again, the first spacing distance S1 may be greater than the second spacing distance S2. In some embodiments, additional spacing between adjacent channel regions 535 and/or display units 425 operates to reduce the probability of sustaining damage within the foldable first region 210, which results in an increased reliability of the display device. Thus, in one embodiment, two adjacent first display units 425 are separated by a first spacing distance S1 along the first direction D1, wherein two adjacent second display units 425 are separated by a second spacing distance S2 along the first direction D1, and wherein the first spacing distance S1 is greater than the second spacing distance S2.

Further, while FIGS. 8A, 8B, and 9 illustrate exemplary spacing distances S1, S2 corresponding to individual channel regions 535 and/or individual display units 425, the person of ordinary skill will understand that the spacing distances S1, S2 between channel regions 535 and/or display units 425 of the display device need not be identical, but may have different spacing distances. For example, the spacing distances within a particular region (e.g., the foldable first region 210, the second region 215-1, or the second region 215-2) may be substantially identical, or may differ from each other. Further, the spacing distances within a particular region may be different from spacing distances within another region.

In some embodiments, the different spacing distances S1, S2 may be used in conjunction with the different dimensions B1, B2 of the channel regions 535 and/or the different areas A1, A2 of the display units.

In some embodiments, the plurality of first display units 425 are arranged to overlap (from a top view) the foldable first region 210 with a first repeating pattern. The plurality of second display units 425 are arranged to overlap (from a top view) the second regions 215-1, 215-2 with a second repeating pattern. The first repeating pattern might be different from the second repeating pattern, but is not limited thereto. For example, the first repeating pattern and/or the second repeating pattern may be rectangular grids with different-sized display units 425 and/or different spacing distance between adjacent first display units 425 or adjacent second display units 425. In other embodiments, the first repeating pattern and/or the second repeating pattern may be PenTile, but is not limited thereto.

In some embodiments, a first channel region 535 of the foldable first region 210 comprises a first semiconductor material, and a second channel region 535 of the second regions 215-1, 215-2 comprises a second semiconductor material. The first semiconductor material and the second semiconductor material may be the same or may be different. For example, the first semiconductor material and the second semiconductor material may comprise low-temperature polysilicon (LTPS), indium gallium zinc oxide (IGZO), polysilicon, amorphous silicon, or so forth.

In one embodiment, the first channel region 535 comprises a first semiconductor material and the second channel region 535 comprises a different second semiconductor material. In one non-limiting example, the first semiconductor material used in the foldable first region 210 comprises LTPS, and the second semiconductor material used in the second regions 215-1, 215-2 comprises IGZO. In some cases, the first semiconductor material may be selected to provide a greater flexibility to the foldable first region 210 and/or to provide a greater reliability for the transistors arranged in the foldable first region 210. The different semiconductor materials may be used in conjunction with any of the other features discussed herein.

Figure 10:
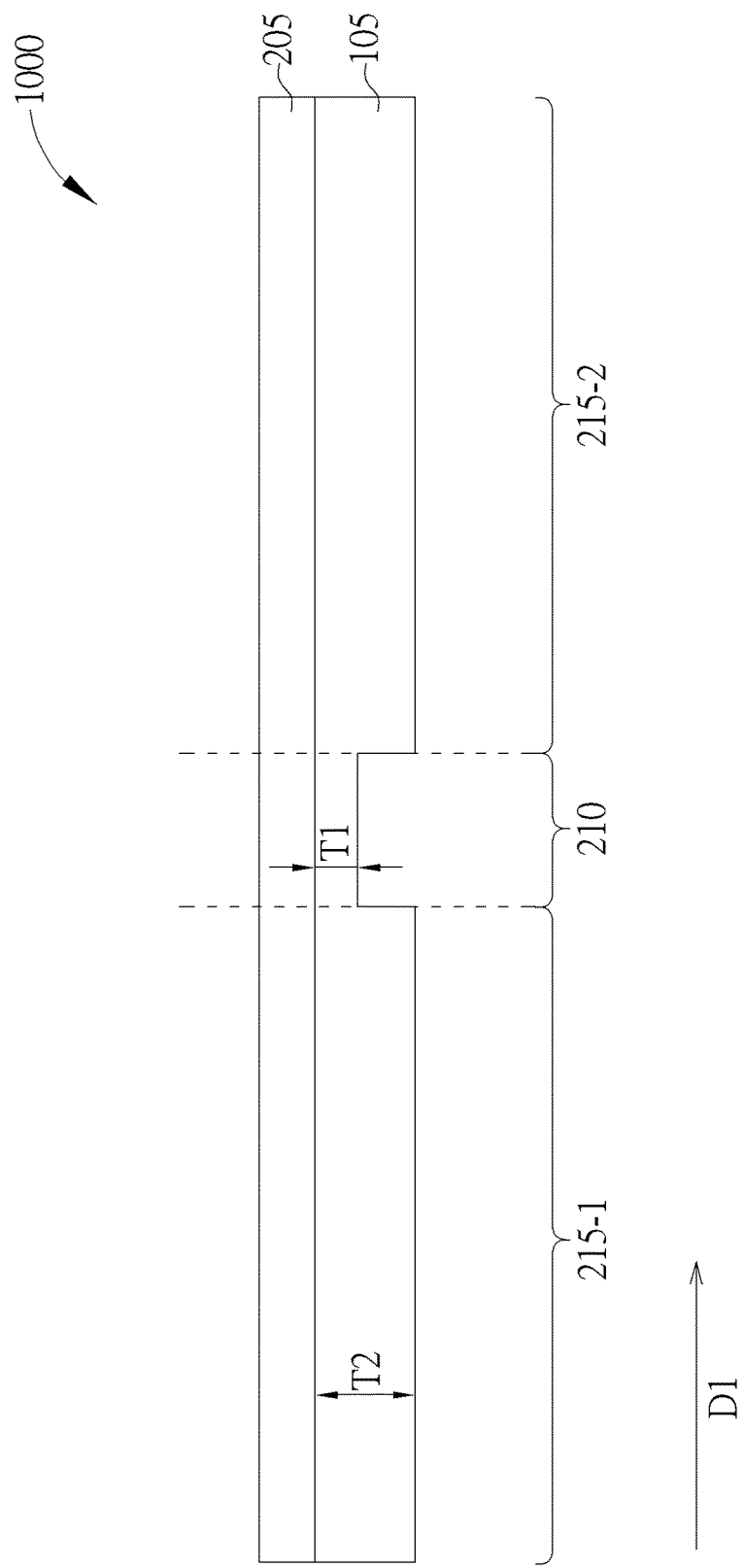
FIG. 10 illustrates a substrate having differently-sized thicknesses, according to embodiments described herein.

FIG. 10 illustrates a substrate having differently-sized thicknesses, according to embodiments described herein. In diagram 1000, the substrate 105 has a first thickness T1 in the foldable first region 210, and a second thickness T2 in the second regions 215-1, 215-2. The first thickness T1 corresponds to a relatively flat area in the foldable first region 210, and the second thickness T2 corresponds to a relatively flat area in the second regions 215-1, 215-2. The first thickness T1 is less than the second thickness T2. The first thickness T1 and the second thickness T2 are measured along a direction perpendicular to the first direction D1. Thus, in one embodiment, the substrate 105 has a first thickness T1 in the foldable first region 210 and has a second thickness T2 in the second region 215-1, 215-2, and wherein the first thickness T1 is less than the second thickness T2.

Based on the manufacturing process, the transition between the first thickness T1 and the second thickness T2 may be substantially immediate or may be gradual. For example, an anisotropic etching of the substrate 105 may provide substantially vertical walls extending from the second thickness T2 to the first thickness T1.

In some embodiments, the reduced first thickness T1 in the foldable first region 210 makes the display device easier to fold and reduces the probability of sustaining damage within the foldable first region 210. The different substrate thicknesses T1, T2 may be used in conjunction with any of the other features discussed herein.

Figure 11:
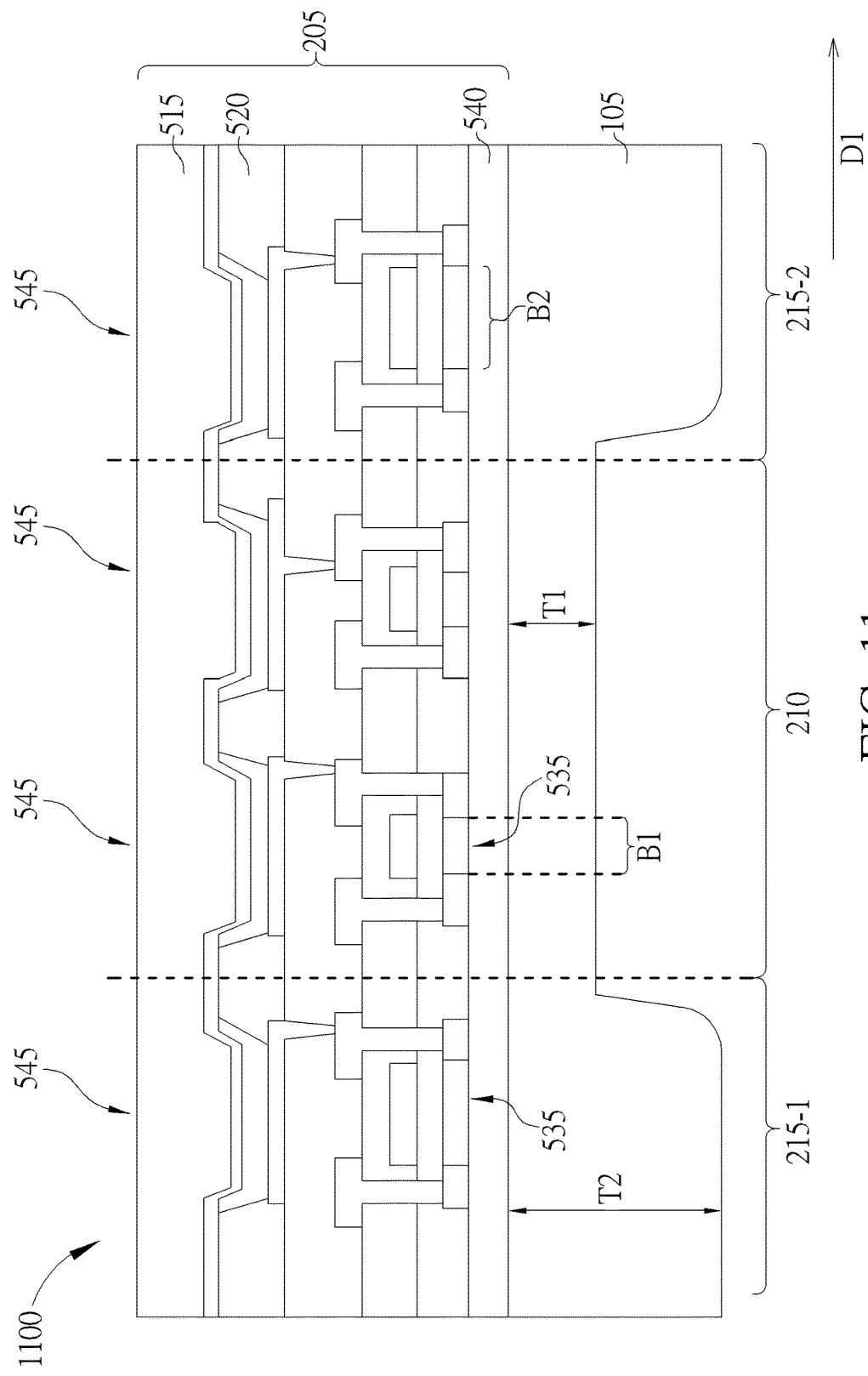
FIG. 11 is a schematic diagram illustrating differently-sized channel regions in conjunction with differently-sized substrate thicknesses, according to embodiments described herein.

FIG. 11 is a schematic diagram 1100 illustrating differently-sized channel regions in conjunction with differently-sized substrate thicknesses, according to embodiments described herein. As shown, one of the channel regions 535 within the foldable first region 210 has a first dimension B1 in the first direction D1, and one of the channel regions 535 within the second regions 215-1, 215-2 has a second dimension B2 in the first direction D1. Additionally, the first thickness T1 in the foldable first region 210 is less than the second thickness T2 in the second regions 215-1, 215-2.

In some embodiments, the dimensions B1, B2 are controlled according to Equations (2, 3):

$$(0<(T1/T2)\leq 0.5)\rightarrow 0.2\leq (B1/B2)\leq 0.8 \quad (2)$$

$$(0.5<(T1/T2)<1)\rightarrow 0.4\leq (B1/B2)\leq 0.95 \quad (3)$$

In other words, when a first ratio of the first thickness T1 to the second thickness T2 is greater than zero and less than or equal to 0.5, a second ratio of the first dimension B1 to the second dimension B2 is greater than or equal to 0.2 and less than or equal to 0.8. When the first ratio is greater than 0.5 and less than 1, the second ratio is greater than or equal to 0.4 and less than or equal to 0.95. In some embodiments, sizing the thicknesses T1, T2 and the dimensions B1, B2 according to Equations (2, 3) operates to reduce the probability of sustaining damage within the first channel region 535, which results in an increased reliability of the display device.

Figure 12:
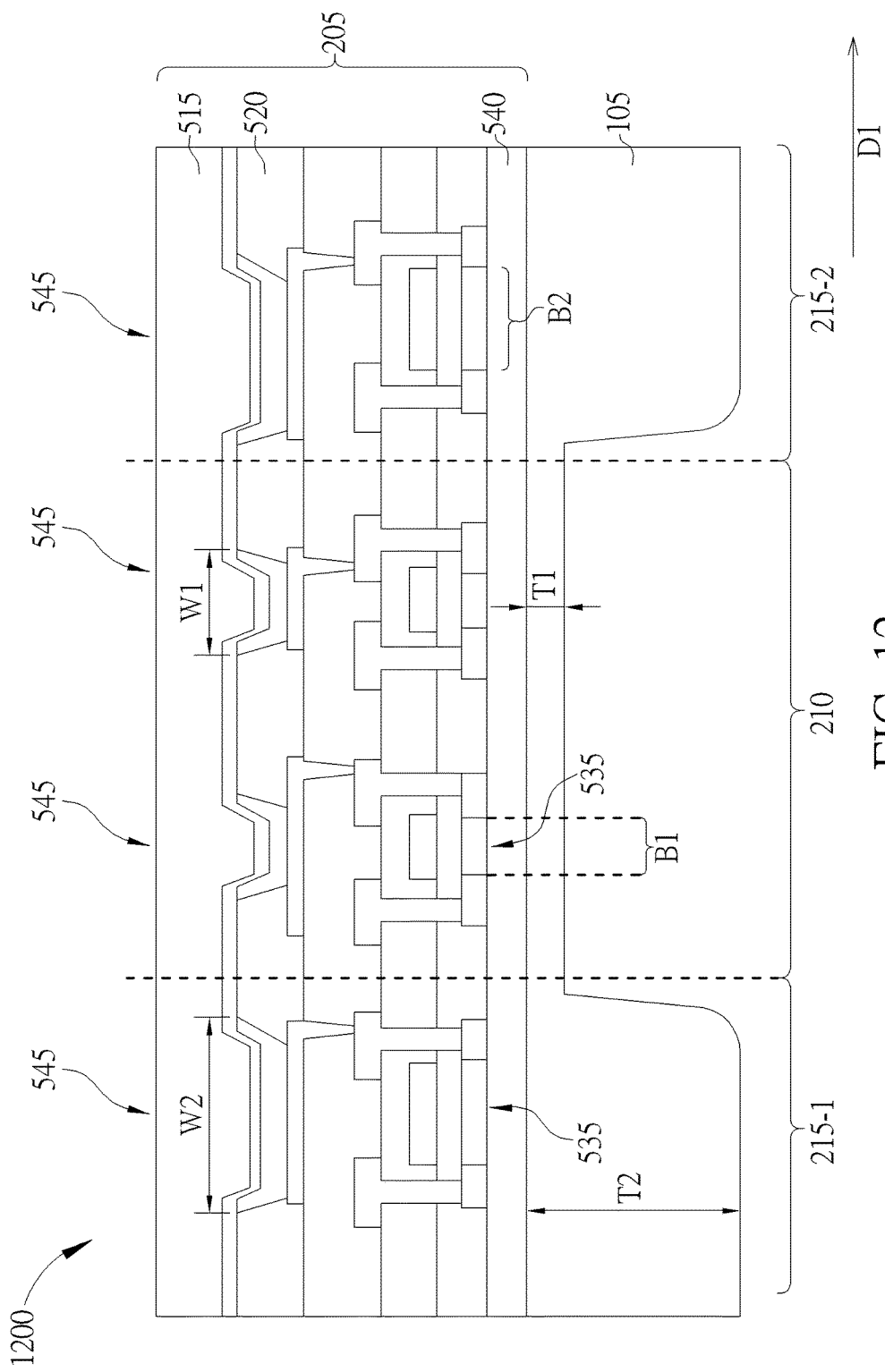
FIG. 12 is a schematic diagram illustrating differently-sized display units in conjunction with differently-sized substrate thicknesses, according to embodiments described herein.

FIG. 12 is a schematic diagram 1200 illustrating differently-sized display units 545 in conjunction with differently-sized substrate thicknesses, according to embodiments described herein. As shown, one of the display units 545 within the foldable first region 210 has a width W1 in the first direction D1, and one of the display units 545 within the second regions 215-1, 215-2 has a width W2 in the first direction D1. The width W1 is a maximum width of one of the display unit 545 within the foldable first region 210 in the first direction D1, and the width W2 is a maximum width of one of the display unit 545 within the second regions 215-1, 215-2 in the first direction D1. Additionally, the first thickness T1 in the foldable first region 210 is less than the second thickness T2 in the second regions 215-1, 215-2.

In some embodiments, the widths W1, W2 are controlled according to Equations (4, 5):

$$(0<(T1/T2)\leq 0.5) \rightarrow 0.3 \leq (W1/W2) \leq 0.8 \quad (4)$$

$$(0.5<(T1/T2)<1) \rightarrow 0.5 \leq (W1/W2) \leq 0.95 \quad (5)$$

In other words, when a first ratio of the first thickness T1 to the second thickness T2 is greater than zero and less than or equal to 0.5, a second ratio of the width W1 to the width W2 is greater than or equal to 0.3 and less than or equal to 0.8. When the first ratio is greater than 0.5 and less than 1, the second ratio is greater than or equal to 0.5 and less than or equal to 0.95. In some embodiments, sizing the thicknesses T1, T2 and the widths W1, W2 according to Equations (4, 5) operates to reduce the probability of sustaining damage within the first channel region 535, which results in an increased reliability of the display device.

Figure 13:
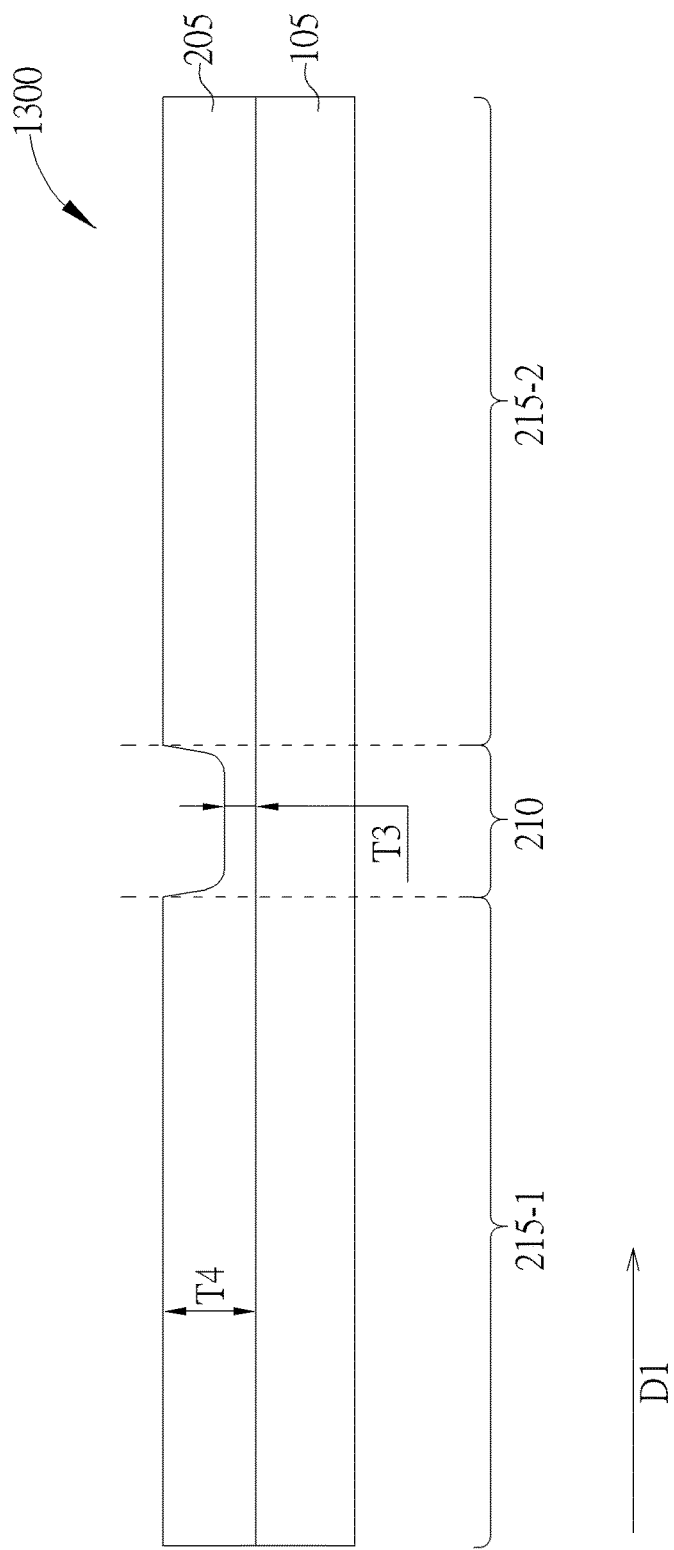
FIGS. 13 and 14 illustrate a display structure having differently-sized thicknesses, according to embodiments described herein.
Figure 14:
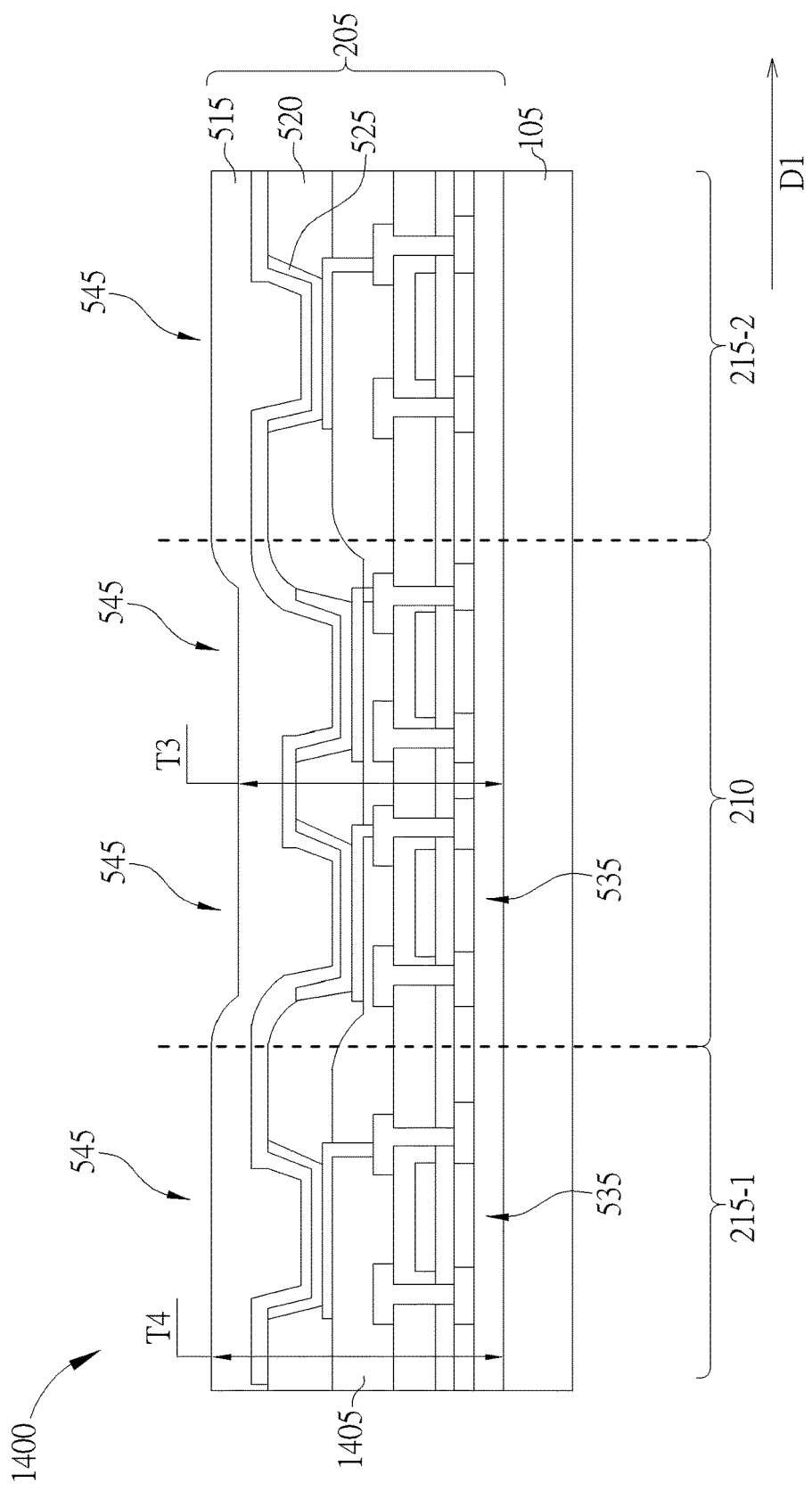

FIGS. 13 and 14 illustrate a display structure 205 having differently-sized thicknesses, according to embodiments described herein. In diagram 1300, the substrate 105 has a substantially constant thickness, and the display structure 205 overlapping the substrate 105. In one embodiment, the display structure 205 has a third thickness T3 in the foldable first region 210, and a fourth thickness T4 in the second regions 215-1, 215-2. The third thickness T3 corresponds to a relatively flat area in the foldable first region 210, and the fourth thickness T4 corresponds to a relatively flat area in the second regions 215-1, 215-2. The third thickness T3 is less than the fourth thickness T4. Based on the manufacturing process, the transition between the third thickness T3 and the fourth thickness T4 may be substantially immediate or may be gradual. For example, an anisotropic etching of the display structure 205 (or one or more component sublayers) may provide substantially vertical walls extending from the fourth thickness T4 to the third thickness T3.

In some embodiments, the reduced third thickness T3 in the foldable first region 210 makes the display device easier to fold and reduces the probability of sustaining damage within the foldable first region 210. The different display structure 205 thicknesses T3, T4 may be used in conjunction with any of the other features discussed herein. For example, the reduced third thickness T3 may be used in conjunction with any of: reduced thickness of the substrate 105, reduced dimensions of the channel regions 535, and reduced size of the display units 545.

Thus, in one embodiment, the display structure 205 overlaps the substrate 105, wherein the display structure 205 has a first thickness T3 overlapping the foldable first region 210 and has a second thickness T4 overlapping the second region 215-1, wherein the first thickness T3 is less than the second thickness T4.

In diagram 1400, the reduced third thickness T3 in the foldable first region 210 is achieved using one or more sublayers of the display structure 205. For example, the encapsulation sublayer 515, the barrier sublayer 520, and/or an insulating sublayer 1405 disposed beneath the barrier sublayer 520 may have a reduced thickness in the foldable first region 210.

Thus, in one embodiment, the encapsulation sublayer 515 has a third thickness overlapping the foldable first region 210 and has a fourth thickness overlapping the second region 215-1, 215-2, wherein the third thickness is less than the fourth thickness. In another embodiment, the insulating sublayer 1405 has a third thickness overlapping the foldable first region 210 and having a fourth thickness overlapping the second region 215-1, 215-2, wherein the third thickness is less than the fourth thickness.

Figure 15:
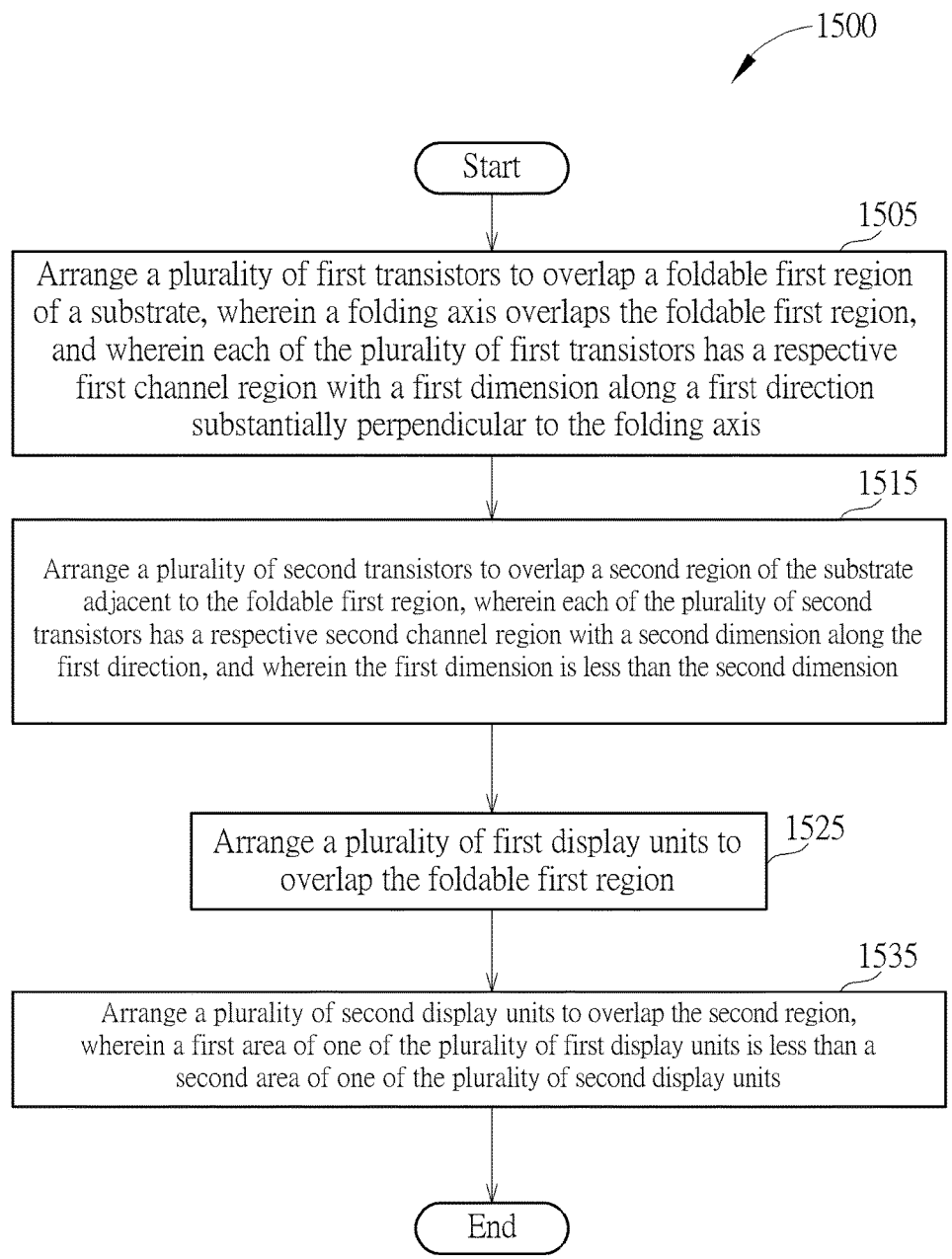
FIG. 15 illustrates an exemplary method of producing a foldable display device, according to embodiments described herein.

FIG. 15 illustrates an exemplary method 1500 of producing a foldable display device, according to embodiments described herein. The method 1500 may be used in conjunction with other embodiments described herein, such as the display devices depicted in FIGS. 5 and 11. The method 1500 may be performed using manufacturing processes known to one of ordinary skill in the art.

The method 1500 begins at block 1505, where a plurality of first transistors are arranged to overlap a foldable first region of a substrate, wherein a folding axis overlaps the foldable first region. Each of the plurality of first transistors has a respective first channel region with a first dimension along a first direction substantially perpendicular to the folding axis. The first direction may also be substantially parallel to the substrate.

At block 1515, a plurality of second transistors are arranged to overlap a second region of the substrate adjacent to the foldable first region. Each of the plurality of second transistors has a respective second channel region with a second dimension along the first direction. The first dimension is less than the second dimension. In some embodiments, blocks 1505 and 1515 are performed at different times (e.g., manufactured separately). In other embodiments, blocks 1505 and 1515 are at least partly overlapping in time. In yet other embodiments, blocks 1505 and 1515 are entirely overlapping in time.

In some embodiments, at block 1525, a plurality of first display units are arranged to overlap the foldable first region. At block 1535, a plurality of second display units are arranged to overlap the second region. A first area of one of the plurality of first display units is less than a second area of one of the plurality of second display units.

In some embodiments, the plurality of first display units are arranged to overlap the foldable first region with a first repeating pattern, and the plurality of second display units are arranged to overlap the second region with a second repeating pattern.

In some embodiments, blocks 1525 and 1535 are performed at different times (e.g., manufactured separately). In other embodiments, blocks 1525 and 1535 are at least partly overlapping in time. In yet other embodiments, blocks 1525 and 1535 are entirely overlapping in time. Method 1500 ends following completion of block 1535.

The various illustrative logical blocks, modules, circuits, and algorithm steps described in connection with the aspects disclosed herein may be implemented as electronic hardware, computer software, or combinations of both. Various changes and modifications may be made herein without departing from the scope of the appended claims. Further, the functions, steps, or actions described in the method claims in accordance with aspects described herein need not be performed in any particular order unless expressly stated otherwise.

In view of the foregoing, the scope of the present disclosure is determined by the claims that follow.

What is claimed is:

1. A display device comprising:
   a substrate having a foldable first region and a second region adjacent to the foldable first region, wherein a folding axis overlaps the foldable first region;
   a first transistor overlapping the foldable first region and having a first channel region with a first dimension along a first direction that is substantially perpendicular to the folding axis; and
   a second transistor overlapping the second region and having a second channel region with a second dimension along the first direction, wherein the first dimension is less than the second dimension;
   wherein the substrate has a first thickness in the foldable first region and has a second thickness in the second region, and the first thickness is less than the second thickness.

2. The display device of claim 1, further comprising:
   a first pixel electrode connected with the first transistor; and
   a second pixel electrode connected with the second transistor.

3. The display device of claim 1, wherein a ratio of the first dimension to the second dimension is greater than or equal to 0.3 and less than or equal to 0.95.

4. The display device of claim 1, wherein a plurality of first transistors are arranged to overlap the foldable first region and a plurality of second transistors are arranged to overlap the second region,
   wherein first channel regions of two adjacent first transistors are separated by a first spacing distance along the first direction,
   wherein second channel regions of two adjacent second transistors are separated by a second spacing distance along the first direction, and
   wherein the first spacing distance is greater than the second spacing distance.

5. The display device of claim 1, wherein a first ratio of the first thickness to the second thickness is greater than zero and less than or equal to 0.5, and
   wherein a second ratio of the first dimension to the second dimension is greater than or equal to 0.2 and less than or equal to 0.8.

6. The display device of claim 1, wherein a first ratio of the first thickness to the second thickness is greater than 0.5 and less than 1, and
   wherein a second ratio of the first dimension to the second dimension is greater than or equal to 0.4 and less than or equal to 0.95.

7. The display device of claim 1, wherein a plurality of first display units are arranged to overlap the foldable first region and a plurality of second display units are arranged to overlap the second region, and
   wherein a first area of one first display unit of the plurality of first display units is less than a second area of one second display unit of the plurality of second display units.

8. The display device of claim 7, wherein at least one of the plurality of first display units and at least one of the plurality of second display units comprise light emitting diodes (LEDs), organic light emitting diodes (OLEDs), quantum dot LEDs (QLEDs), or micro-LEDs.

9. The display device of claim 7, wherein two adjacent first display units are separated by a first spacing distance along the first direction,
   wherein two adjacent second display units are separated by a second spacing distance along the first direction, and
   wherein the first spacing distance is greater than the second spacing distance.

10. The display device of claim 7, wherein
    a first ratio of the first thickness to the second thickness is greater than zero and less than or equal to 0.5, and
    wherein a second ratio of a width of the one first display unit in the first direction to a width of the one second display unit in the first direction is greater than or equal to 0.3 and less than or equal to 0.8.

11. The display device of claim 7, wherein
    a first ratio of the first thickness to the second thickness is greater than 0.5 and less than 1, and
    wherein a second ratio of a width of the one first display unit in the first direction to a width of the one second display unit in the first direction is greater than or equal to 0.5 and less than or equal to 0.95.

12. The display device of claim 1, further comprising:
    a display structure overlapping the substrate, wherein the display structure has a third thickness overlapping the foldable first region and has a fourth thickness overlapping the second region,
    wherein the third thickness is less than the fourth thickness.

13. The display device of claim 1, wherein the first channel region comprises a first semiconductor material and the second channel region comprises a different second semiconductor material.

14. A method of producing a foldable display device, the method comprising:
    arranging a plurality of first transistors to overlap a foldable first region of a substrate, wherein a folding axis overlaps the foldable first region, and wherein each of the plurality of first transistors has a respective first channel region with a first dimension along a first direction substantially perpendicular to the folding axis;
    arranging a plurality of second transistors to overlap a second region of the substrate adjacent to the foldable first region, wherein each of the plurality of second transistors has a respective second channel region with a second dimension along the first direction, and wherein the first dimension is less than the second dimension;
    wherein the substrate has a first thickness in the foldable first region and has a second thickness in the second region, and the first thickness is less than the second thickness.

15. The method of claim 14, further comprising:
    arranging a plurality of first display units to overlap the foldable first region; and
    arranging a plurality of second display units to overlap the second region,
    wherein a first area of one of the plurality of first display units is less than a second area of one of the plurality of second display units.

16. The method of claim 15, wherein the plurality of first display units are arranged to overlap the foldable first region with a first repeating pattern, and
    wherein the plurality of second display units are arranged to overlap the second region with a second repeating pattern.

17. A display device comprising:
- a substrate having a foldable first region and a second region adjacent to the foldable first region, wherein a folding axis overlaps the foldable first region; and
- a display structure overlapping the substrate;
- a plurality of first transistors included in the display structure and overlapping the foldable first region; and
- a plurality of second transistors included in the display structure and overlapping the second region,
- wherein the display structure has a first thickness overlapping the foldable first region and has a second thickness overlapping the second region, and
- wherein the first thickness is less than the second thickness.

18. The display device of claim 17, wherein the display structure comprises an encapsulation sublayer defining an external surface of the display device,
- wherein the encapsulation sublayer has a third thickness overlapping the foldable first region and has a fourth thickness overlapping the second region, and
- wherein the third thickness is less than the fourth thickness.

19. The display device of claim 17, wherein the display structure comprises an insulating sublayer having a third thickness overlapping the foldable first region and having a fourth thickness overlapping the second region, and
- wherein the third thickness is less than the fourth thickness.

\* \* \* \* \*